United States Patent
Kawaguchi et al.

(10) Patent No.: US 9,018,533 B2
(45) Date of Patent: Apr. 28, 2015

(54) COVERLAY FILM, METHOD FOR MANUFACTURING COVERLAY FILM, AND FLEXIBLE PRINTED WIRING BOARD

(75) Inventors: Toshiyuki Kawaguchi, Tokyo (JP); Kazutoki Tahara, Saitama (JP); Tsutomu Saga, Saitama (JP)

(73) Assignee: Shin-Etsu Polymer Co., Ltd. (JP)

( * ) Notice: Subject to any disclaimer, the term of this patent is extended or adjusted under 35 U.S.C. 154(b) by 532 days.

(21) Appl. No.: 13/203,855

(22) PCT Filed: Mar. 4, 2010

(86) PCT No.: PCT/JP2010/001509
§ 371 (c)(1),
(2), (4) Date: Aug. 30, 2011

(87) PCT Pub. No.: WO2010/100931
PCT Pub. Date: Sep. 10, 2010

(65) Prior Publication Data
US 2011/0308841 A1 Dec. 22, 2011

(30) Foreign Application Priority Data
Mar. 6, 2009 (JP) ................................. 2009-054041

(51) Int. Cl.
*H05K 1/00* (2006.01)
*H05K 1/02* (2006.01)
(Continued)

(52) U.S. Cl.
CPC ............ *H05K 1/0218* (2013.01); *H05K 1/0393* (2013.01); *H05K 3/281* (2013.01); *H05K 2201/0317* (2013.01)

(58) Field of Classification Search
USPC .................. 174/254, 250–253, 255–258, 268
See application file for complete search history.

(56) References Cited

U.S. PATENT DOCUMENTS 6,833,576 B2 * 12/2004 Agarwal et al. ................ 257/300
2003/0089520 A1 * 5/2003 Ooyabu et al. ................. 174/255
(Continued)

FOREIGN PATENT DOCUMENTS

JP   A-02-033999   2/1990
JP   07-283579    10/1995
(Continued)

OTHER PUBLICATIONS

Notice of Allowance issued by the Japanese Patent Office on Nov. 6, 2012 in connection with corresponding Japanese Patent Application No. 2009-054041.
(Continued)

*Primary Examiner* — Tremesha S Willis
(74) *Attorney, Agent, or Firm* — Ostrolenk Faber LLP

(57) ABSTRACT

Provided are: a cover-lay film which has an electromagnetic wave shielding function and excellent flexibility, enables a reduction in the thickness of a flexible printed wiring board, and eliminates the necessity of connecting a layer for shielding electromagnetic noise, to the ground circuit of the flexible printed wiring board; a method for manufacturing the same; and a flexible printed wiring board. Employed is a cover-lay film including: a base material film which has a roughened surface (textured surface) created on at least a part of one surface, and an unroughened surface (non-textured surface) excluding the roughened surface; and a deposition film made of a conductive material which is formed on a surface of the base material film on the side where the roughened surface has been created.

12 Claims, 6 Drawing Sheets

(51) Int. Cl.
*H05K 1/03* (2006.01)
*H05K 3/28* (2006.01)

(56) References Cited

U.S. PATENT DOCUMENTS

| 2005/0150683 | A1* | 7/2005 | Farnworth et al. | 174/255 |
| 2008/0202583 | A1* | 8/2008 | Lee | 136/262 |

FOREIGN PATENT DOCUMENTS

| JP | 09-027695 | 1/1997 |
| JP | A-2000-269632 | 9/2000 |
| JP | A-2005-277262 | 10/2005 |
| JP | A-2006-007589 | 1/2006 |
| JP | A-2006-156946 | 6/2006 |
| WO | WO 2008/075746 | 6/2008 |
| WO | WO 2009/019963 A1 | 2/2009 |

OTHER PUBLICATIONS

Translation of the Notice of Allowance issued by the Japanese Patent Office on Nov. 6, 2012 in connection with corresponding Japanese Patent Application No. 2009-054041.

International Search Report dated Apr. 20, 2010, issued in corresponding international application No. PCT/JP2010/001509.

* cited by examiner

COVERLAY FILM, METHOD FOR MANUFACTURING COVERLAY FILM, AND FLEXIBLE PRINTED WIRING BOARD

TECHNICAL FIELD

The present invention relates to a cover-lay film which has an electromagnetic wave shielding function, a method for manufacturing the same, and a flexible printed wiring board including the same.

CROSS REFERENCE TO RELATED APPLICATIONS

The present application is a 35 U.S.C. §371 National Phase conversion of PCT/JP2010/001509, filed Mar. 4, 2010, which claims benefit of Japanese Application No. 2009-054041, filed Mar. 6, 2009, the disclosure of which is incorporated herein by reference. The PCT International Application was published in the Japanese language.

BACKGROUND ART

Electromagnetic noise generated from a flexible printed wiring board, electronic components, and the like, has an influence on other electric circuits and electronic components. This may cause a malfunction or the like. Therefore, it is necessary to shield them from electromagnetic noise. For this reason, an attempt has been made to impart an electromagnetic wave shielding function to a flexible printed wiring board.

In addition, with the miniaturization and multi-functionalization of electronic equipment equipped with a flexible printed wiring board, the space allowed for the flexible printed wiring board is becoming smaller and smaller. For this reason, it is required for a flexible printed wiring board to have a reduced thickness, to have a reduced bending radius, and to ensure its wiring conductor does not become disconnected even under severe bending conditions, so as to exhibit its functions.

As a flexible printed wiring board which has an electromagnetic wave shielding function, for example, the following have been proposed.

(1) A flexible printed wiring board, wherein an undercoat layer, a shielding layer coated with a metal powder-containing conductive paste, and an overcoat layer are sequentially provided over a copper foil wiring circuit on the surface of a heat resisting plastic film, and the ground pattern of the copper foil wiring circuit and the shielding layer are electrically connected through the undercoat layer with an appropriate space therebetween (Patent Document 1).

(2) A flexible printed wiring board, wherein an electromagnetic wave shielding film, in which a metal thin film layer and a metal filler-containing conductive adhesive layer have been sequentially provided on one surface of a cover-lay film, is mounted on a substrate film, in which an insulating layer for insulating a printed circuit excluding a part of a ground circuit has been provided, so that the conductive adhesive layer is adhered to the insulating layer and the part of the ground circuit (Patent Document 2).

However, the flexible printed wiring board of (1) involves the following problems.

(i) The metal powder-containing shielding layer is fragile since it includes numerous interfaces between different materials, and thus does not have sufficient strength against repetitive bending of the flexible wiring board.

(ii) The undercoat layer is necessary to keep the insulation between the shielding layer and the copper foil wiring circuit excluding the part of the ground pattern, and hence the flexible printed wiring board has to be thick.

(iii) It is necessary to form a through hole in a part of the undercoat layer so as to electrically connect the part of the ground pattern and the shielding layer. Thus, it takes time and labor to process the through hole.

Moreover, the flexible printed wiring board of (2) involves the following problems.

(i) The metal filler-containing conductive adhesive layer is fragile since it includes numerous interfaces between different materials, and thus does not have sufficient strength against repetitive bending of the flexible wiring board.

(ii) The insulating layer is necessary to keep the insulation between the conductive adhesive layer and the printed circuit excluding the part of the ground circuit, and hence the flexible printed wiring board has to be thick.

(iii) It is necessary to form a through hole in a part of the insulating layer so as to electrically connect the part of the ground pattern and the conductive adhesive layer. Thus, it takes time and labor to process the through hole.

PRIOR ART DOCUMENTS

Patent Documents

Patent Document 1: Japanese Unexamined Patent Application, First Publication No. H02-33999
Patent Document 2: Japanese Laid-Open Patent Application No. 2000-269632

DISCLOSURE OF INVENTION

Problems to be Solved by the Invention

The present invention provides: a cover-lay film which has an electromagnetic wave shielding function and excellent flexibility, enables a reduction in the thickness of a flexible printed wiring board, and eliminates the necessity of connecting a layer for shielding electromagnetic noise, to the ground circuit of the flexible printed wiring board; a method for manufacturing the same; and a flexible printed wiring board.

Means to Solve the Problems

The cover-lay film of the present invention includes: a base material film which has a textured surface created on at least a part of one surface, and a non-textured surface excluding the textured surface; and a deposition film made of a conductive material which is formed on a surface of the base material film on the side where the textured surface has been created.

It is preferable that the surface resistance $R_1$ of the deposition film formed on the non-textured surface is from 0.01 to 5Ω, and the surface resistance $R_2$ of the deposition film formed on the textured surface is two to one hundred times higher than the surface resistance $R_1$.

Preferably, the textured surface is repeatedly created at intervals.

It is preferable that the cover-lay film of the present invention further includes a protective layer provided on a surface of the deposition film.

It is preferable that the cover-lay film of the present invention further includes an insulation adhesive layer provided on the outermost layer.

The method of manufacturing a cover-lay film of the present invention comprises the following Step (I) and Step (II):

(I) a step of creating a textured surface on at least a part of one surface of a base material film; and (II) a step of forming a deposition film made of a conductive material by physical vapor deposition of a metal on a surface of the base material film on the side where the textured surface has been created.

The flexible printed wiring board of the present invention includes: a flexible printed wiring board main body in which a wiring conductor is formed on an insulation film; and the cover-lay film of the present invention which is pasted on the flexible printed wiring board main body.

The cover-lay film of the present invention has an electromagnetic wave shielding function and excellent flexibility, enables a reduction in the thickness of a flexible printed wiring board, and eliminates the necessity of connecting a layer for shielding electromagnetic noise, to the ground circuit of the flexible printed wiring board.

The method for manufacturing a cover-lay film of the present invention is capable of manufacturing a cover-lay film which has an electromagnetic wave shielding function and excellent flexibility, enables a reduction in the thickness of a flexible printed wiring board, and eliminates the necessity of connecting a layer for shielding electromagnetic noise, to the ground circuit of the flexible printed wiring board.

The flexible printed wiring board of the present invention has an electromagnetic wave shielding function and excellent flexibility, can have a reduced thickness, and imposes no necessity of connecting a layer for shielding electromagnetic noise, to the ground circuit. Furthermore, since there is no need of insulating and separating the wiring conductor using an insulating layer (such as a usual cover-lay film having no electromagnetic wave shielding function), the number of components can be reduced and the labor for executing the steps can be saved.

BEST MODE FOR CARRYING OUT THE INVENTION

<Cover-Lay Films>

Figure 1:
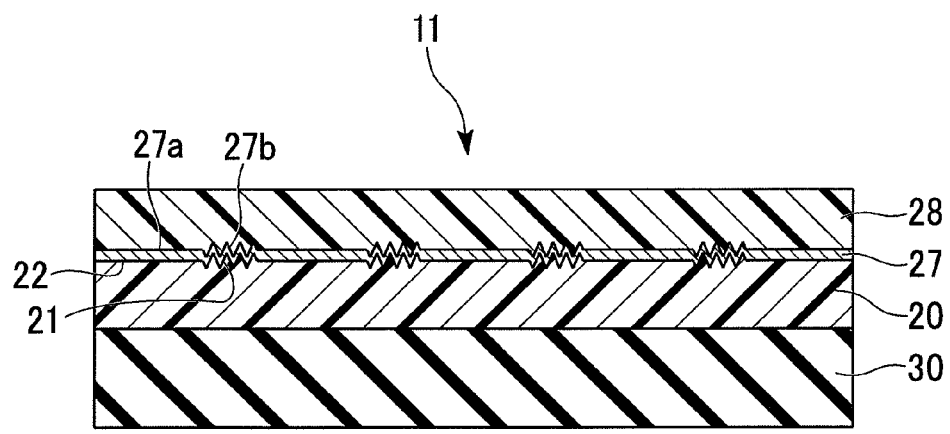
FIG. 1 is a cross-sectional view showing an example of the cover-lay film of the present invention.

FIG. 1 is a cross-sectional view showing an example of the cover-lay film of the present invention. The cover-lay film 11 includes: a base material film 20 which has roughened surfaces 21 (textured surfaces) created by roughening some parts of one surface, and an unroughened surface 22 (non-textured surface) excluding the roughened surfaces 21; a deposition film 27 made of a conductive material which is formed on a surface of the base material film 20 on the side where the roughened surfaces 21 have been created; a protective layer 28 provided on the surface of the deposition film 27; and an insulation adhesive layer 30 provided on the surface of the base material film 20 on the opposite side to the side where the roughened surfaces 21 have been created.

Figure 2:
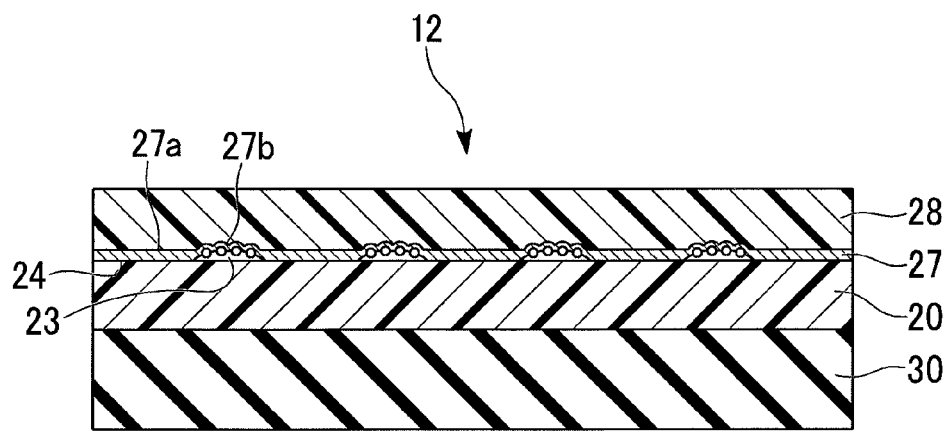
FIG. 2 is a cross-sectional view showing another example of the cover-lay film of the present invention.

FIG. 2 is a cross-sectional view showing another example of the cover-lay film of the present invention. The cover-lay film 12 includes: a base material film 20 which has printed surfaces 23 (textured surfaces) created by printing some parts of one surface, and an unprinted surface 24 (non-textured surface) excluding the printed surfaces 23; a deposition film 27 made of a conductive material which is formed on a surface of the base material film 20 on the side where the printed surfaces 23 have been created; a protective layer 28 provided on the surface of the deposition film 27; and an insulation adhesive layer 30 provided on the surface of the base material film 20 on the opposite side to the side where the printed surfaces 23 have been created.

Figure 3:
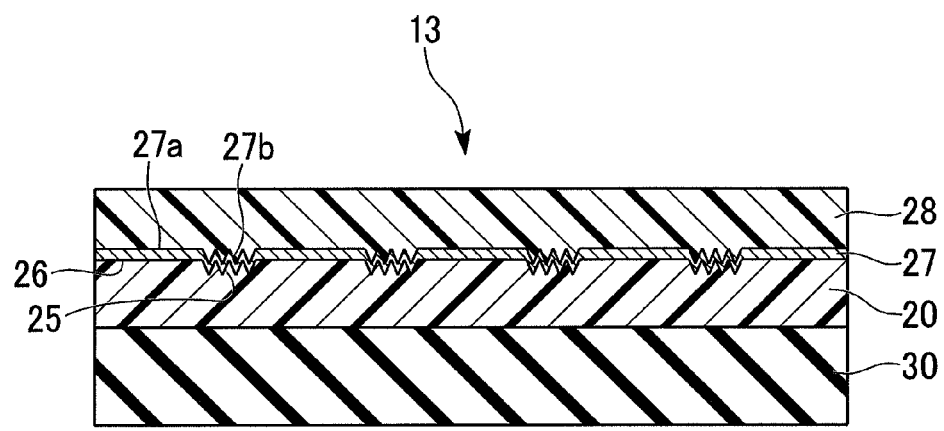
FIG. 3 is a cross-sectional view showing yet another example of the cover-lay film of the present invention.

FIG. 3 is a cross-sectional view showing yet another example of the cover-lay film of the present invention. The cover-lay film 13 includes: a base material film 20 which has etched surfaces 25 (textured surfaces) created by etching some parts of one surface, and an unetched surface 26 (non-textured surface) excluding the etched surfaces 25; a deposition film 27 made of a conductive material which is formed on a surface of the base material film 20 on the side where the etched surfaces 25 have been created; a protective layer 28 provided on the surface of the deposition film 27; and an insulation adhesive layer 30 provided on the surface of the base material film 20 on the opposite side to the side where the etched surfaces 25 have been created.

Figure 4:
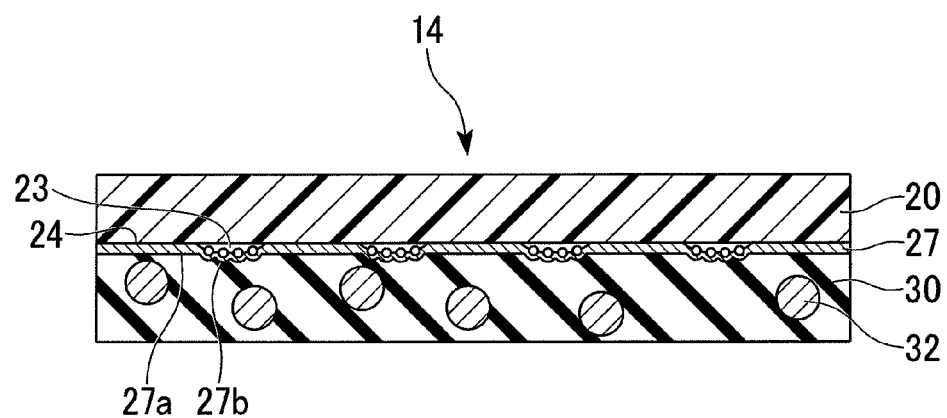
FIG. 4 is a cross-sectional view showing even yet another example of the cover-lay film of the present invention.

FIG. 4 is a cross-sectional view showing even yet another example of the cover-lay film of the present invention. The cover-lay film 14 includes: a base material film 20 which has printed surfaces 23 (textured surfaces) created by printing some parts of one surface, and an unprinted surface 24 (non-textured surface) excluding the printed surfaces 23; a deposition film 27 made of a conductive material which is formed on a surface of the base material film 20 on the side where the printed surfaces 23 have been created; and an insulation adhesive layer 30 which includes insulation spacer particles 32 and is provided on the surface of the deposition film 27.

(Base Material Film)

The base material film 20 is a film serving as a foundation for forming the deposition film 27.

Examples of the material of the base material film 20 include a resin and a rubber elastic body.

The resin can be exemplified by a polyimide, a liquid crystal polymer, a polyaramid, a polyphenylene sulfide, a polyamide imide, a polyetherimide, a polyethylene naphthalate, a polyethylene terephthalate, or the like.

The surface resistance of the base material film 20 is preferably $1\times10^6\Omega$ or higher.

The thickness of the base material film 20 is preferably from 3 to 25 μm in terms of flexibility.

(Textured Surface)

The textured surface can be exemplified by the roughened surface 21 created by roughening the surface of the base material film 20, the printed surface 23 created by printing the surface of the base material film 20, the etched surface 25 created by etching the surface of the base material film 20, or the like.

The roughening treatment can be exemplified by a blasting treatment or the like. When the material of the base material film 20 is a polyimide, the roughening can also be achieved by an alkali treatment.

The printing can be exemplified by gravure printing, flexo printing, or the like. It is preferable to contain an antiblocking agent (such as polymer particles) in the printing ink to be used for the printing because this makes it easier to create a texture on the printed surface 23.

The etching treatment can be exemplified by wet etching, dry etching (such as laser etching), or the like.

The arithmetic mean roughness Ra of the textured surface is preferably from 0.3 to 3 μm. If the arithmetic mean roughness Ra of the textured surface is 0.3 μm or higher, the deposition film 27b to be formed on the textured surface will be sufficiently thinned, and thereby the surface resistance R2 of the deposition film 27b can be sufficiently raised. If the arithmetic mean roughness Ra of the textured surface is 3 μm or lower, the reduction in the strength of the base material film 20 can be alleviated.

The arithmetic mean roughness Ra is defined by the regulations of JIS B0651: 1996.

The shape of the portion to create the textured surface can be exemplified by a bar shape, a circular shape, a hooked shape, a swirl shape, or the like.

It is preferable that the maximum length of one textured surface is one-fourth or shorter than the wavelength of the electromagnetic noise to be shielded by the deposition film 27.

The size of one textured surface is preferably from 0.1 to 40 mm$^2$, and more preferably from 0.25 to 20 mm$^2$, in terms of the electromagnetic wave shielding function of the deposition film 27.

It is preferable that the textured surface is repeatedly created at predetermined pitches all over the whole surface of the base material film 20 so that the deposition film 27 can evenly shield electromagnetic noise.

It is preferable that the total area of the textured surfaces accounts for 10 to 50% of the area of the deposition film 27 (100%). If the total area of the textured surfaces accounts for 10% or greater, it becomes possible for the deposition film 27b to achieve a sufficient loss of the high frequency current running through the deposition film 27a, which will be described later. If the total area of the textured surfaces accounts for 50% or smaller, there is no need of thickening the deposition film 27a in order to retain the electromagnetic wave shielding function.

(Non-Textured Surface)

The non-textured surface (the unroughened surface 22, the unprinted surface 24, and the unetched surface 26) is a surface to which a roughening treatment, printing, an etching treatment, or the like, has not been actively applied. The non-textured surface may be slightly textured as long as the arithmetic mean roughness Ra is sufficiently smaller than that of the textured surface.

It is preferable that the arithmetic mean roughness Ra of the non-textured surface is 0.1 μm or lower. If the arithmetic mean roughness Ra of the non-textured surface is 0.1 μm or lower, the deposition film 27a to be formed on the non-textured surface will be sufficiently thickened, and thereby the surface resistance R1 of the deposition film 27a can be sufficiently lowered.

(Deposition Film)

The deposition film 27 is a film made of a conductive material which is formed by physical vapor deposition of a metal on a surface of the base material film 20.

Examples of the conductive material include a metal and a conductive ceramic.

The metal can be exemplified by gold, silver, copper, aluminum, nickel, or the like.

It is preferable that the conductive material is a conductive ceramic in terms of the improvement of environment-resistant characteristics. The conductive ceramic can be exemplified by an alloy, an intermetallic compound, a solid solution, and the like, which consist of a metal with one or more types of elements selected from boron, carbon, nitrogen, silicon, phosphorus, and sulfur. Specific examples thereof include nickel nitride, titanium nitride, tantalum nitride, chromium nitride, titanium carbide, silicon carbide, chromium carbide, vanadium carbide, zirconium carbide, molybdenum carbide, tungsten carbide, chromium boride, molybdenum boride, chromium silicide, zirconium silicide, and the like.

The physical vapor deposition method can be exemplified by an EB vapor deposition method, an ion beam deposition method, a sputtering method, and the like. It is also possible to carry out the physical vapor deposition under a gas stream so as to make a ceramic.

The surface resistance of the deposition film 27 differs between the deposition film 27a formed on the non-textured surface of the base material film 20 and the deposition film 27b formed on the textured surface of the base material film 20. In other words, since the actual area of the textured surface of the base material film 20 is larger than the projected area of the surface of the base material film 20 as viewed from the top in the orthogonal direction, because of the textured dimension, then the deposition film 27b formed on the textured surface of the base material film 20 is thinner than the deposition film 27a formed on the non-textured surface when an equal deposition amount of metal is subjected to the physical vapor deposition. As a result, the surface resistance R2 of the deposition film 27b is higher than the surface resistance R1 of the deposition film 27a.

The surface resistance R1 of the deposition film 27a is preferably from 0.01 to 5Ω, and more preferably from 0.01 to 1Ω, in terms of the electromagnetic wave shielding function to reflect electromagnetic waves. If the surface resistance R1 is 0.01Ω or higher, the amount of transmission attenuation is very large. If the surface resistance R1 is 5Ω or lower, the amount of transmission attenuation is sufficiently large at 3 dB.

The thickness of the deposition film 27a is preferably from 50 to 200 nm, and more preferably from 50 to 100 nm, in terms of the surface resistance value and the flex resistant characteristic.

The surface resistance R2 of the deposition film 27b is preferably two to one hundred times higher, more preferably five to one hundred times higher, and yet more preferably ten to one hundred times higher, than the surface resistance R1 of deposition film 27a, in terms of the sufficient loss of the high frequency current running through the deposition film 27a.

The thickness of the deposition film 27b is preferably from 5 to 100 nm, and more preferably from 5 to 50 nm, in terms of the surface resistance value.

The transmission attenuation characteristic of the deposition film 27 is preferably −10 dB or lower, and more preferably −20 dB or lower. The transmission attenuation characteristic can be measured by using the coaxial tube type shield effect measurement system (a product of KEYCOM Corp.) which conforms to ASTM D4935 and which measures the shielding effect with a plane wave.

(Protective Layer)

The protective layer 28 is a layer to protect the deposition film 27 from external contact.

The protective layer 28 is a layer made of a resin or a rubber elastic body. The surface resistance of the protective layer 28 is preferably $1\times10^6 \Omega$ or higher.

The protective layer 28 can be exemplified by a layer composed of a film, a coated film made by the application of a paint, or the like.

Examples of the material of the film can be given by similar materials to those of the base material film 20.

The thickness of the protective layer 28 is preferably from 3 to 25 μm in terms of flexibility.

(Cover-Lay Film Main Body)

The thickness of the cover-lay film main body (the thickness of the cover-lay film 11 to 14 excluding the insulation adhesive layer 30) is preferably from 3 to 50 μm in terms of flexibility. If the thickness of the cover-lay film main body is 3 μm or thicker, the cover-lay film 11 to 14 has sufficient strength and the reliability of insulation is improved. If the thickness of the cover-lay film main body is 50 μm or thinner, the flexibility of the flexible printed wiring board is excellent, and therefore the wiring conductor will be hardly cracked even with repetitive bending. Thus, disconnection will hardly occur.

(Insulation Adhesive Layer)

The insulation adhesive layer 30 is to paste the cover-lay film main body onto the flexible printed wiring board.

As the insulation adhesive, preferred are a semi-hardened epoxy resin in which a rubber component (such as a carboxyl-modified nitrile rubber) for giving flexibility is contained, a thermoplastic polyimide, and the like. Such an insulation adhesive becomes a fluid state by heating, such as hot pressing, and exhibits adhesiveness by re-activation.

It is also possible to contain spacer particles 32 (such as silicon oxide, titanium oxide, and magnesium hydroxide) having a particle diameter of about 1 to 10 μm in the insulation adhesive, so as to avoid contact between the deposition film 27 and the wiring conductor of the flexible printed wiring board which results from flow of the insulation adhesive. These particles may have another function such as fluidity regulation or fire resistance.

The thickness of the insulation adhesive layer 30 is preferably from 5 to 40 μm, and more preferably from 10 to 20 μm, so that the insulation adhesive can become a fluid state so as to sufficiently fill in the space between lines of the wiring conductor of the flexible printed wiring board.

The above-mentioned cover-lay films 11 to 14 have an electromagnetic wave shielding function even if the deposition film 27 is not connected to the ground circuit of the flexible printed wiring board, for the reason described below. Therefore, the necessity of giving conductivity to the adhesive layer so as to connect the deposition film 27 to the ground circuit is eliminated, and the flexibility is thus improved. Moreover, since the adhesive layer is not conductive, there is no need of preparing an insulating layer for insulating between the adhesive layer and the wiring conductor of the flexible printed wiring board, which makes it possible to reduce the thickness of the flexible printed wiring board.

Reason:

The reason why it is not necessary to connect the deposition film 27 to the ground circuit of the flexible printed wiring board can be attributed to the following phenomenon.

The deposition film 27a, which has been formed on the non-textured surface and has a relatively low surface resistance, acts as an antenna because the deposition film 27a is not connected to the ground circuit. So, electromagnetic noise flows inside the deposition film 27a in the form of a high frequency current and re-radiates from the edge thereof. At the time of the re-radiation, the electromagnetic field fluctuates at the edge of the deposition film 27a. In the meantime, eddy currents resulting from the fluctuation of the magnetic field flow into the deposition film 27b, which has been formed on the textured surface and has a relatively high surface resistance. This causes a loss of heat. Therefore, the energy of the electromagnetic noise is considered to be attenuated.

<Method for Manufacturing Cover-Lay Film>

The method for manufacturing the cover-lay film of the present invention includes the following Step (I) to Step (IV):

(I) a step of creating a textured surface on at least a part of one surface of a base material film;

(II) a step of forming a deposition film made of a conductive material by physical vapor deposition of a metal on a surface of the base material film on the side where the textured surface has been created;

(III) a step of providing a protective layer on the surface of the deposition film, as required; and (IV) a step of providing an insulation adhesive layer on the outermost layer.

The method for creating the textured surface can be exemplified by roughening treatment, printing, and etching treatment as mentioned above, or the like.

The method for forming the deposition film can be exemplified by the physical vapor deposition method mentioned above.

The method for providing the protective layer can be exemplified by a method of pasting a film, a method of applying a paint, or the like.

The method for providing the insulation adhesive layer can be exemplified by a method of pasting a sheet-form insulation adhesive, a method of applying a liquid-form insulation adhesive, or the like.

<Flexible Printed Wiring Board>

FIGS. 5 to 8 are cross-sectional views showing respective examples of the flexible printed wiring board of the present invention. The flexible printed wiring boards 41 to 44 respectively includes: a flexible printed wiring board main body 50 in which a high speed signal line 52 (wiring conductor) and a different line 53 (wiring conductor) are formed on one surface of an insulation film 51, and a ground layer 54 is formed on the other surface of the insulation film 51; and the cover-lay film 11 to 14 which is pasted by an insulation adhesive layer 30 onto a surface of the flexible printed wiring board main body 50 on the side having these wiring conductors.

The edge of the flexible printed wiring board 41 to 44 is not covered with the cover-lay film 11 to 14, for the purpose of soldering connection, connection using a connector, mounting of some components, and the like. The other area than the edge is bendable, normally up to 180 degrees with a bending outer diameter of 1 to 3 mm.

(Flexible Printed Wiring Board Main Body)

The flexible printed wiring board main body 50 has a microstrip structure in which a high speed signal line 52 is held on one surface of the insulation film 51 and a ground layer 54 is held on the other surface, or the like.

The flexible printed wiring board main body 50 is made by forming a copper foil of a copper-clad laminate in a pattern of a desired shape through an existing etching technique.

The copper-clad laminate can be exemplified by: a single- or double-sided board of a two or three layer structure in which a copper foil has been pasted on at least one side of an insulation film with an adhesive; a single-sided board of a two layer structure in which a resin solution or the like for forming a film has been cast on a copper foil; or the like.

The copper foil can be exemplified by a rolled copper foil, an electrolytic copper foil, or the like. Preferred is a rolled copper foil in terms of flexibility. The thickness of the copper foil is preferably from 3 to 18 µm.

(Insulation Film)

The surface resistance of the insulation film 51 is preferably $1 \times 10^6 \Omega$ or higher.

The insulation film 51 is preferably a film having a heat resisting property, and more preferably a polyimide film, a liquid crystal polymer film, or the like.

The thickness of the insulation film 51 is preferably from 5 to 50 µm, more preferably from 6 to 25 µm, and particularly preferably from 10 to 25 µm, in terms of flexibility.

(High Speed Signal Line)

The high speed signal line 52 is a line to transmit a high frequency signal of 1 GHz or higher frequency. The frequency of the high frequency signal is preferably 3 GHz or higher, more preferably 10 GHz or higher, and particularly preferably 40 GHz or higher.

The high speed signal line 52 has a microstrip structure or a coplanar structure, the transmission characteristic of which is improved by the ground layer 54 and/or a ground line that has/have been disposed to separately face the signal line.

(Different Line)

The different line 53 is a line other than the high speed signal line 52. The different line 53 can be exemplified by a power line, a linear ground line, a low speed signal line to transmit a lower frequency signal than that of the high speed signal line 52 (such as a line for controlling the bias voltage and a line for controlling the light power monitor), or the like.

The above-mentioned flexible printed wiring boards 41 to 44 have an electromagnetic wave shielding function even if the deposition film 27 is not connected to the ground circuit of the wiring conductor, for the reason described above. Therefore, the necessity of giving conductivity to the adhesive layer so as to connect the deposition film 27 to the ground circuit is eliminated, and the flexibility is thus improved. Moreover, since the adhesive layer is not conductive, there is no need of preparing an insulating layer for insulating between the adhesive layer and the wiring conductor, which makes it possible to reduce the thickness of the flexible printed wiring board 41 to 44. In addition, the labor and the time to form a through hole in the insulating layer so as to electrically connect the ground circuit and the conductive adhesive layer, which has been so far necessary, are no longer needed.

EXAMPLES

Hereunder is a description of Examples. Note that the present invention is not to be limited to these Examples.
(Thickness of Each Layer)

The cross-section of the cover-lay film was observed by using a transmission electron microscope (H9000NAR, a product of Hitachi, Ltd.). The thicknesses of five points of each layer were measured and averaged.

(Surface Resistance)

Two thin film metal electrodes (length 10 mm, width 5 mm, and distance between these electrodes 10 mm) that had been formed by vapor deposition of gold on a quartz glass were used. The measuring object was placed on these electrodes. While pressing a 10 mm×20 mm area of the measuring object by the application of a load of 50 g from above the measuring object, the resistance between the electrodes was measured with a test current of 1 mA or lower. This value was deemed as the surface resistance.

(Evaluation of Electromagnetic Wave Shielding Function)

The electromagnetic wave shielding function of the cover-lay film was evaluated. Using the system shown in FIG. 9, electromagnetic noise (ranging from 1 MHz to 2 GHz) was sent out from a shielded loop antenna 74 (loop diameter 8 mm, and distance from loop center to microstrip line 76 of 10 mm) which was connected to a tracking generator equipped with a spectrum analyzer 72 through a coaxial cable, and this noise was received by the micro strip line 76 whose line length was 55 mm (Z 50Ω, substrate size 50 mm×80 mm, and whole surface of the backside grounded). By so doing, the reception characteristics under both the conditions where the microstrip line 76 was covered and not covered with the cover-lay film were measured by the spectrum analyzer 72.

(Evaluation of Flexibility)

Figure 10:
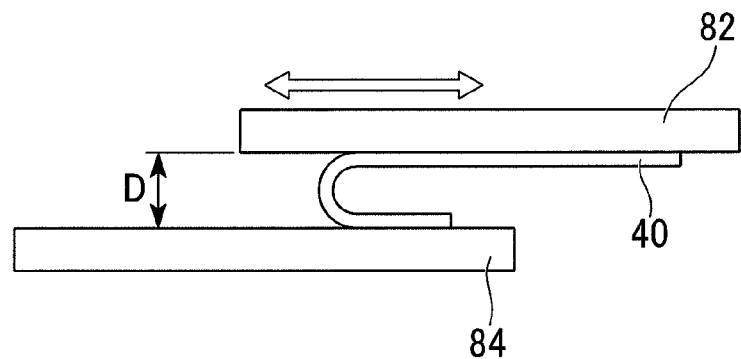
FIG. 10 is a diagram illustrating a method for evaluating flexibility.

As shown in FIG. 10, the flexible printed wiring board 40 was fixed to two sliding substrates 82 and 84, and the resistance value between terminal electrodes was monitored. The distance D between the substrate 82 and the substrate 84 was the bending outer diameter (=bending radius×2). The slide condition was such that the stroke was 40 mm, the number of cycles was 60 times/minute, and the number of cycles at which the resistance value had reached two times higher than the initial resistance value was deemed as the number of cycles to failure.

Example 1

The cover-lay film 11 having the structure shown in FIG. 1 was produced in the following manner.

One surface of a polyimide film having a size of 80 mm×80 mm×a thickness of 12.5 µm (the base material film 20 whose arithmetic mean roughness Ra was 0.08 µm) was covered with a mask in which 1 mm×3 mm holes were formed at 5 mm pitch, and was then subjected to a blasting treatment, thereby creating roughened surfaces 21 (the textured surfaces whose arithmetic mean roughness Ra was 1.6 µm) in positions corresponding to the holes.

On the surface of the polyimide film on the side where the roughened surfaces 21 had been created, an aluminum deposition film (the deposition film 27) was formed by physical vapor deposition of aluminum through a magnetron sputtering method. The surface resistance R1 of the deposition film 27a formed on the non-textured surface was 0.5Ω, while the surface resistance R2 of the deposition film 27b formed on the textured surface was 1.8Ω.

The surface of the aluminum deposition film was applied with an acrylic urethane paint and dried, thereby forming the protective layer 28 in a size of 80 mm×80 mm×a thickness of 3 µm.

The surface of the polyimide film on the opposite side to the side where the roughened surfaces 21 had been created was applied with an insulation adhesive made of a nitrile rubber-modified epoxy resin so that the dried film thickness would be 20 µm, thereby producing the cover-lay film 11 as shown in FIG. 1.

From the cover-lay film 11, a sample was cut out into the same size as that of the microstrip substrate used for evaluating the electromagnetic wave shielding function (50 mm×80 mm).

Figure 9:
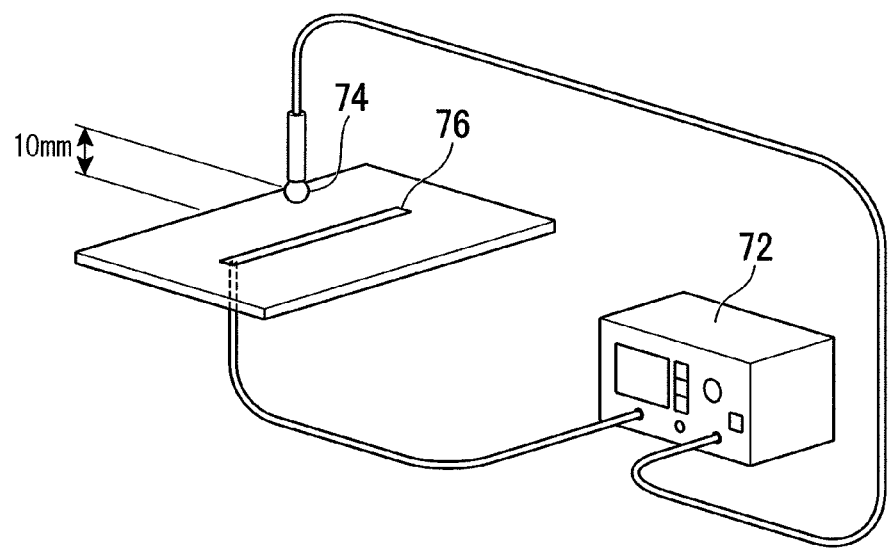
FIG. 9 is a block diagram showing a system used for the evaluation of the electromagnetic wave shielding function.
Figure 11:
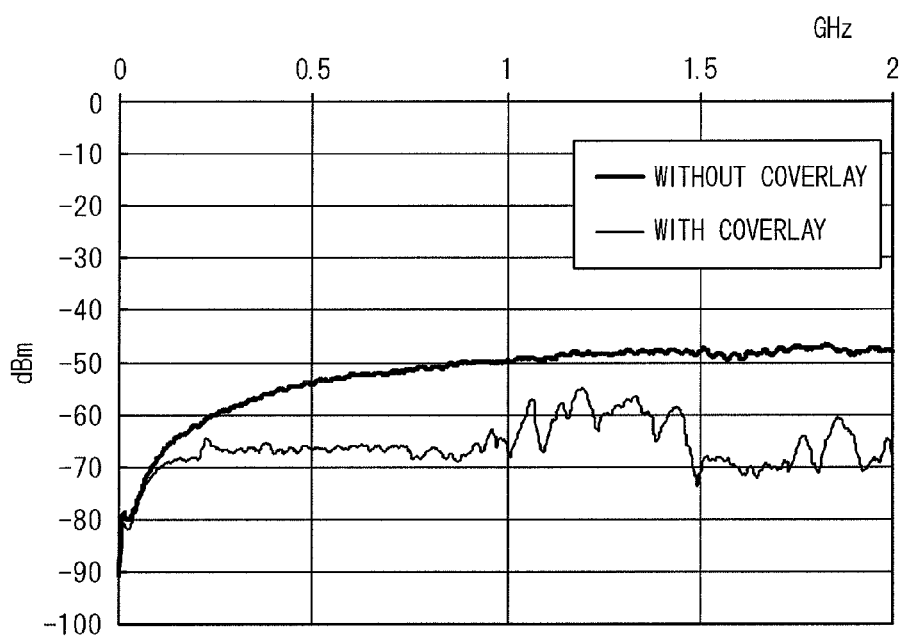
FIG. 11 is a graph showing reception characteristics measured by the evaluation of the electromagnetic wave shielding function in Example 1.

The microstrip substrate shown in FIG. 9 was pressed with the sample on the side of the insulation adhesive layer 30, thereby covering the microstrip line 76 with the cover-lay film 11. Swept high frequency signals ranging from 1 MHz to 2 GHz were sent out from the shielded loop antenna 74 to measure the reception characteristic. The reception characteristic is shown in FIG. 11. In addition, the reception characteristic under the condition where the microstrip line 76 was not covered with the cover-lay film 11 is also shown in FIG. 11. The reception characteristic under the condition where the microstrip line 76 was covered with the cover-lay film 11 showed attenuation of a few dB to a maximum of 20 dB as compared to the condition where the microstrip line 76 was not covered with the cover-lay film 11.

Figure 5:
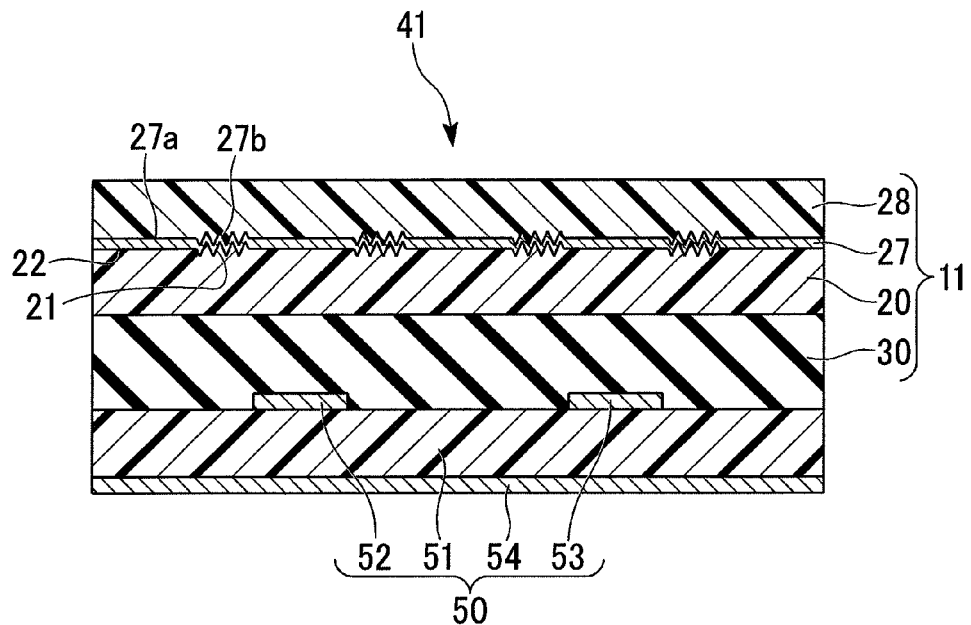
FIG. 5 is a cross-sectional view showing an example of the flexible printed wiring board of the present invention.
Figure 6:
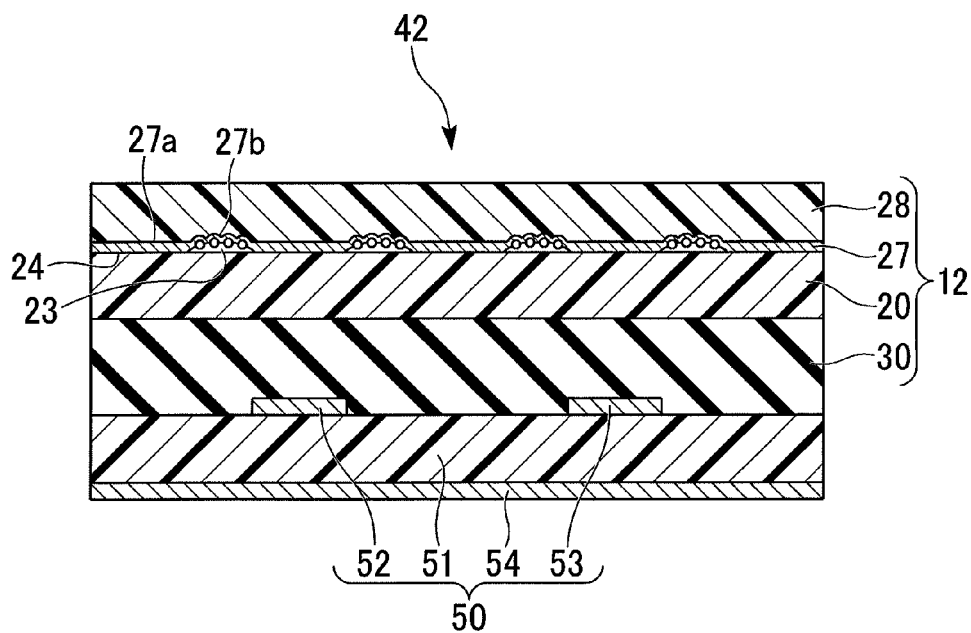
FIG. 6 is a cross-sectional view showing another example of the flexible printed wiring board of the present invention.
Figure 7:
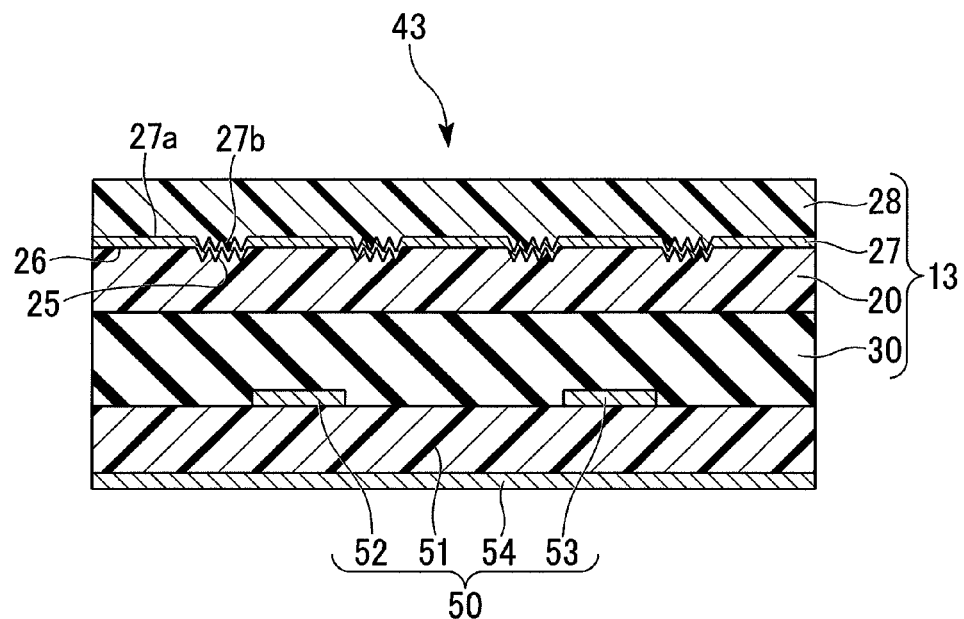
FIG. 7 is a cross-sectional view showing yet another example of the flexible printed wiring board of the present invention.
Figure 8:
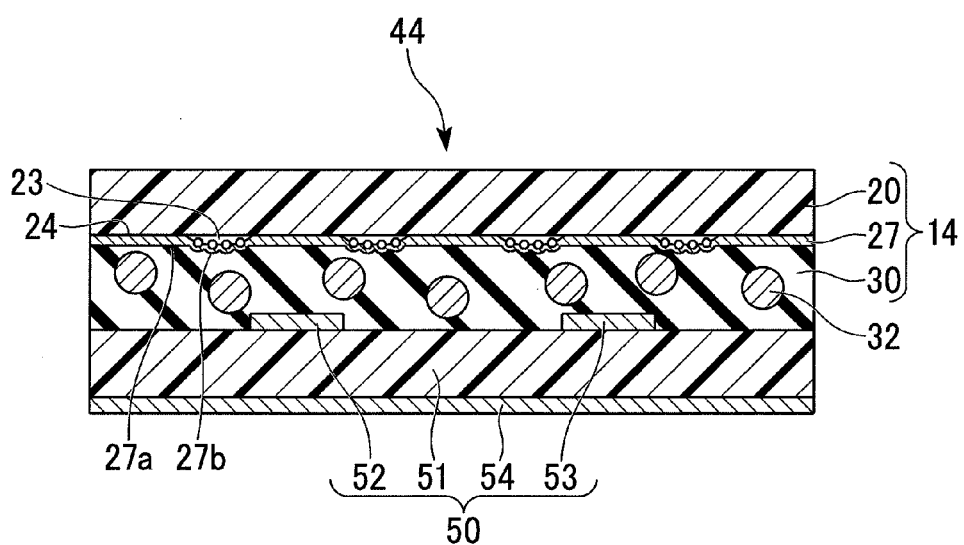
FIG. 8 is a cross-sectional view showing even yet another example of the flexible printed wiring board of the present invention.

Next, as shown in FIG. 5, the cover-lay film 11 was pasted on the flexible printed wiring board main body 50, thereby producing the flexible printed wiring board 41.

The flexible printed wiring board 41 was connected to the substrate 82 and the substrate 84 by soldering as shown in FIG. 10, and was subjected to measurement of the number of cycles to failure by sliding the substrates with the distance D of 1 mm (the bending radius was 0.5 mm), the stroke of 40 mm, and the number of cycles of 60 times/minute. The number of cycles to failure was 620,000 cycles.

Comparative Example 1

Figure 12:
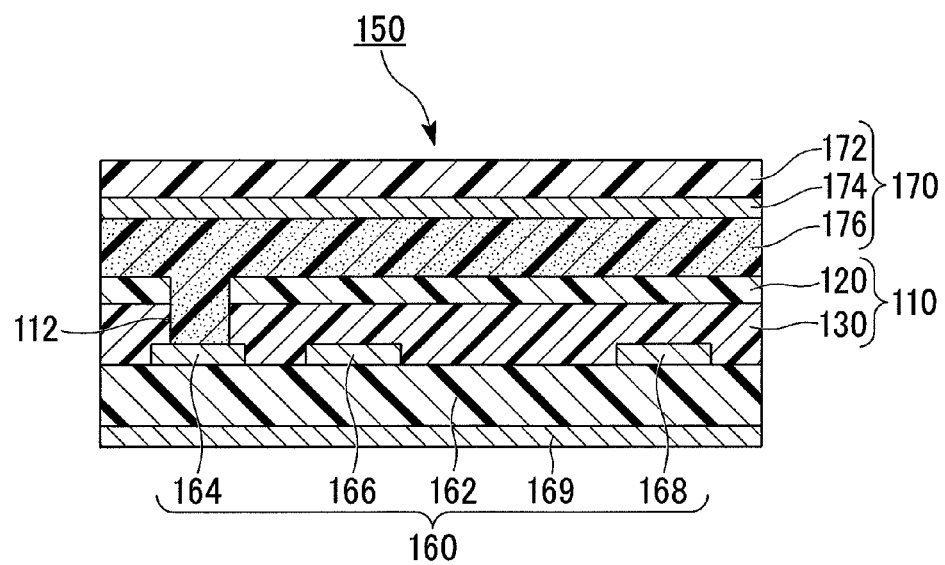
FIG. 12 is a cross-sectional view showing an example of a conventional type of flexible printed wiring board.

The flexible printed wiring board 150 having the structure shown in FIG. 12 was produced.

First, the surface of a polyimide film 120 having a thickness of 12.5 μm was applied with an insulation adhesive made of a nitrile rubber-modified epoxy resin so that the dried film thickness would be 20 μm, thereby forming an insulation adhesive layer 130. By so doing, a cover-lay film 110 was produced. A through hole 112 was formed in the cover-lay film 110 for the purpose of earthing.

Next, a flexible printed wiring board main body 160 in which a ground line 164, a power line 166, and a high speed signal line 168 had been formed on the top surface of the polyimide film 162 having a thickness of 12 μm, and a ground layer 169 had been provided on the back surface thereof, was prepared.

The cover-lay film 110 was pasted on the flexible printed wiring board main body 160 except for the terminal electrodes, by hot pressing.

On the surface of a polyphenylene sulfide film 172 having a thickness of 3 μm, an aluminum deposition film 174 was formed to a thickness of 100 nm by physical vapor deposition of aluminum through an ion beam deposition method.

A conductive adhesive in which nickel particles having an average particle diameter of 10 μm had been dispersed at 5 volume % in an insulation adhesive made of a nitrile rubber-modified epoxy resin, was prepared.

The surface of the aluminum deposition film 174 was applied with the conductive adhesive so that the dried film thickness would be 12 μm, thereby forming a conductive adhesive layer 176. By so doing, an electromagnetic wave shielding film 170 was produced.

The electromagnetic wave shielding function was evaluated in the same manner as that of Example 1, except that the aluminum deposition film 174 of the electromagnetic wave shielding film 170 was earthed by contacting it to an earthed probe. The electromagnetic wave shielding effect was equivalent to that of Example 1.

Next, the electromagnetic wave shielding film 170 was pasted onto the side of the cover-lay film 110 by hot pressing, thereby producing the flexible printed wiring board 150 as shown in FIG. 12. The aluminum deposition film 174 of the electromagnetic wave shielding film 170 on the side of the cover-lay film 110 was earthed to the ground circuit of the wiring conductor 164 through the conductive adhesive layer 176 in the through hole 112.

The flexibility of the flexible printed wiring board was evaluated in the same manner as that of Example 1. The number of cycles to failure was 300,000, which was inferior to Example 1.

INDUSTRIAL APPLICABILITY

The flexible printed wiring board including the cover-lay film of the present invention is useful as a flexible printed wiring board for small electronic equipment such as an optical transceiver, a mobile phone, a digital camera, a game machine, and a laptop computer.

BRIEF DESCRIPTION OF THE REFERENCE SYMBOLS

11 Cover-lay Film
12 Cover-lay Film
13 Cover-lay Film
14 Cover-lay Film
20 Base Material Film
21 Roughened Surface (Textured Surface)
22 Unroughened Surface (Non-Textured Surface)
23 Printed Surface (Textured Surface)
24 Unprinted Surface (Non-Textured Surface)
25 Etched Surface (Textured Surface)
26 Unetched Surface (Non-Textured Surface)
27 Deposition Film
27a Deposition Film
27b Deposition Film
28 Protective Layer
30 Insulation Adhesive Layer
40 Flexible Printed Wiring Board
41 Flexible Printed Wiring Board
42 Flexible Printed Wiring Board
43 Flexible Printed Wiring Board
44 Flexible Printed Wiring Board
50 Flexible Printed Wiring Board Main Body
51 Insulation Film
52 High Speed Signal Line (Wiring Conductor)
53 Different Line (Wiring Conductor)

What is claimed is:

1. A cover-lay film comprising: a base material film comprising a resin or a rubber elastic body, the base material film having a textured surface created on at least a part of one surface of the base material film, and a non-textured surface on the one surface excluding the part where the textured surface is created, the base material film having a thickness of 3 to 25 μm, and the textured surface having an arithmetic mean roughness Ra of 0.3 to 3 μm and a size of 0.1 to 40 mm$^2$; and a deposition film made of a conductive material which is formed on the one surface of said base material film on a side where said textured surface has been created, wherein a portion of the deposition film formed on said non-textured surface exhibits a surface resistance R1 of from 0.0 to 5Ω, and a portion of the deposition film formed on said textured surface exhibits a surface resistance R2 of two to one hundred times greater than the surface resistance R1.

2. The cover-lay film according to claim 1, wherein said textured surface is repeatedly created at intervals.

3. The cover-lay film according to claim 1, further comprising a protective layer provided on a surface of said deposition film.

4. The cover-lay film according to claim 1, further comprising an insulation adhesive layer provided on an outermost layer of the cover-lay film.

5. A method of manufacturing a cover-lay film comprising the following Step (I) and Step (II):
   (I) a step of creating a textured surface on at least a part of one surface of a base material film comprising a resin or a rubber elastic body, so as to leave a non-textured surface on the one surface excluding the part where the textured surface is created, the base material film having a thickness of 3 to 25 µm, and the textured surface having an arithmetic mean roughness Ra of 0.3 to 3 µm and a size of 0.1 to 40 mm$^2$; and
   (II) a step of forming a deposition film made of a conductive material by physical vapor deposition of a metal on the one surface of said base material film on a side where said textured surface has been created,
   wherein a portion of the deposition film formed on said non-textured surface exhibits a surface resistance R1 of from 0.01 to 5Ω, and
   a portion of the deposition film formed on said textured surface exhibits a surface resistance R2 of two to one hundred times greater than the surface resistance R1.

6. A flexible printed wiring board comprising:
   a flexible printed wiring board main body in which a wiring conductor is formed on an insulation film; and
   the cover-lay film according claim 1 which is pasted on said flexible printed wiring board main body.

7. The cover-lay film according to claim 2, further comprising a protective layer provided on a surface of said deposition film.

8. The cover-lay film according to claim 2, further comprising an insulation adhesive layer provided on an outermost layer of the cover-lay film.

9. The cover-lay film according to claim 3, further comprising an insulation adhesive layer provided on an outermost layer of the cover-lay film.

10. A flexible printed wiring board comprising:
    a flexible printed wiring board main body in which a wiring conductor is formed on an insulation film; and
    the cover-lay film according to claim 2 which is pasted on said flexible printed wiring board main body.

11. A flexible printed wiring board comprising:
    a flexible printed wiring board main body in which a wiring conductor is formed on an insulation film; and
    the cover-lay film according to claim 3 which is pasted on said flexible printed wiring board main body.

12. A flexible printed wiring board comprising:
    a flexible printed wiring board main body in which a wiring conductor is formed on an insulation film; and
    the cover-lay film according to claim 4 which is pasted on said flexible printed wiring board main body.

\* \* \* \* \*